United States Patent [19]
Lee et al.

[11] Patent Number: 5,504,384
[45] Date of Patent: Apr. 2, 1996

[54] MULTI-MODE ADJUSTABLE PIEZOELECTRIC TRANSFORMER

[75] Inventors: Yu-Lin Lee, Keelung; Syh-Yuh Cheng, Taichung; Yun-Tien Chen, Hsinchu; Shu-Fen Liao, Taoyuan; Wen-Chin Yeh, Taipei, all of Taiwan

[73] Assignee: Industrial Technology Research Institute, Hsinchu, Taiwan

[21] Appl. No.: 343,352

[22] Filed: Nov. 21, 1994

Related U.S. Application Data

[63] Continuation of Ser. No. 81,664, Jun. 23, 1993, abandoned.

[51] Int. Cl.$^6$ .................... H01L 41/047; H01L 41/08
[52] U.S. Cl. .................. 310/359; 310/318; 310/366
[58] Field of Search ................... 310/317–319, 310/359, 365, 366

[56] References Cited

U.S. PATENT DOCUMENTS

| | | | |
|---|---|---|---|
| 2,742,614 | 4/1956 | Mason | 310/359 |
| 2,830,274 | 4/1958 | Rosen et al. | 310/358 |
| 2,953,755 | 9/1960 | Mattiat | 310/359 |
| 2,974,296 | 3/1961 | Rosen | 310/359 |
| 3,609,415 | 9/1971 | Kawada | 310/318 |
| 3,659,127 | 4/1972 | Kumon | 310/359 |
| 3,707,636 | 12/1972 | Inoue | 310/318 |
| 3,736,446 | 5/1973 | Berlincourt et al. | 310/359 |
| 3,764,848 | 10/1973 | Berlincourt | 310/359 |
| 4,347,593 | 8/1982 | Trott | 310/359 |
| 4,459,505 | 7/1984 | Lim | 310/318 |

FOREIGN PATENT DOCUMENTS

| | | | |
|---|---|---|---|
| 3123104 | 5/1982 | Germany | 310/317 |
| 63-272084 | 11/1988 | Japan | H01L 41/08 |
| 0738014 | 5/1980 | U.S.S.R. | 310/318 |

*Primary Examiner*—Thomas M. Dougherty
*Attorney, Agent, or Firm*—Merchant, Gould, Smith, Edell, Welter & Schmidt

[57] ABSTRACT

A type of piezoelectric transformer (PT) which vibrates in length extensional mode is provided. The piezoelectric transformer (PT) has a piezoelectric substrate which has a first dimension, a second dimension and a third dimension with the first dimension being longest and the third dimension being shortest. The substrate has two polarization directions parallel to the first dimension near two terminals of the first dimension and at least two opposite polarization directions on a central portion of the substrate transversely to the first dimension. The substrate further has at least two electrodes on a portion horizontal to the first dimension. Comparing with traditional piezoelectric transformers, the new one can solve the polarization difficulties and reduce audio noise output without sacrificing the electrical properties or even have better voltage transformation characteristics.

20 Claims, 11 Drawing Sheets

MULTI-MODE ADJUSTABLE PIEZOELECTRIC TRANSFORMER

This is a continuation of application Ser. No. 08/081,664, filed Jun. 23, 1993 now abandoned.

BACKGROUND OF THE INVENTION

The present invention is related to a piezoelectric ceramic transformer and, more particularly to a structure for the above-type transformer which provides multi-mode adjustments for various outputs and a high power efficiency.

Piezoelectric ceramic transformers are small in volume, simple in construction, light in weight and have high transforming ratios which are advantageous over the conventional transformers including a magnetic core and windings. The monolithic piezoelectric ceramic transformers, however, have limitations in the designs of topography and polarization, and the majority of the transformers only comprise one operation mode ($\lambda$ mode or $\lambda/2$ mode) such that the transformers are polarized with difficultly, have lower operational frequency and can generate a large amount of noise in operation.

One of the conventional piezoelectric transformers is disclosed in U.S. Pat. No. 3,736,446 by Berlincourt et al. The disclosure teaches a ceramic piezoelectric transformer made of ferro-dielectric material which comprises a third set of electrodes coupled to one of the other sets of electrodes enabling the transformer to accomplish self-oscillation. The substrate of the transformer has different polarization directions to provide resonant voltage output. Although such a transformer has a $\lambda/2$ and a $\lambda$ operation modes simultaneously ($\lambda$=the wavelength measured in the direction of the wave propagation), it can not efficiently enable or disable any one of the modes as desired. Further, the transformer only has one load voltage output terminal so that the transformed ratio of the voltage or current will be low due to the limitations of the length, width and thickness of the piezoelectric substrate thereof. Besides, for a large piezoelectric substrate, the polarization thereof is difficult.

U.S. Pat. No. 3,659,127 discloses a piezoelectric ceramic transformer with specific width to length ratios of which the piezoelectric substrate is composed of an input portion and an output portion. The patent comprises first and second vibration modes ($\lambda/2$ mode and $\lambda$ mode) and the output voltages thereof are adjustable by changing the ratios of the length to width of the piezoelectric substrate. In this case, to obtain higher voltage outputs, the length and the width of the substrate should be increased which will result in difficulty in polarization of the substrate. Further, the transformer has only one load voltage output so that it can not enable or disable any of the vibration modes efficiently.

U.S. Pat. No. 2,830,274 teaches a piezoelectric transformer of which the central electrode is polarized transversely to the plane of the substrate of transformer and the remaining portions (the portions to the right and left of the central portion) are polarized longitudinally in a single direction. The central portion further comprises two short-circuit circular electrodes. Transformed voltages of the two circular electrodes are output from two terminals of the substrate. Since the polarization direction of the right and left portion in this case is consistent, the desired polarized voltage will be larger and the polarization process of the piezoelectric substrate will be more complex in comparison with the present invention having a substrate with the same size. Besides, the patent only has a $\lambda/2$ operation mode and thus, the transformer will have lower operational frequency resulting in a large amount of noise.

Another prior art piezoelectric transformer is shown in Japanese Publication No. JP 63-272084. In this application, the piezoelectric substrate is H-shaped of which the central portion is polarized vertically and the remaining portions are polarized longitudinally in a single direction. The transformed voltage is output from the two terminals of the H-shaped substrate. The device can comprise more than one output terminals but the H-shaped construction is difficult to be manufactured. Similarly, such a transformer has a low operational frequency and a large amount of noise.

SUMMARY OF THE INVENTION

Accordingly, one object of the present invention is to provide a ceramic piezoelectric transformer which comprises both $\lambda/2$ and $\lambda$ operation modes and a plurality of selectable electrodes so that the transformer is adjustable to have various operational frequencies and operation modes as desired.

Another object of the present invention is to provide a piezoelectric ceramic transformer which can be easily polarized and have various operation frequencies by selecting the combination of the input and output terminals. Therefore, the piezoelectric transformer of the present invention will have higher output power efficiency and less noise interference.

In accordance with the present invention, a multi-mode adjustable piezoelectric ceramic transformer is provided. It has a piezoelectric substrate which has a first dimension, a second dimension and a third dimension with the first dimension being longest and the third dimension being shortest. The substrate has two polarization directions parallel to the first dimension near two terminals of the first dimension and at least two opposite polarization directions on a central portion of the substrate transversely to the first dimension. The substrate further has at least two electrodes on a portion horizontal to the first dimension.

Other features and advantages of the invention will be apparent from the following examples, in connection with the accompanying drawings wherein:

DETAILED DESCRIPTION OF THE PREFERRED EMBODIMENT

Figure 1:
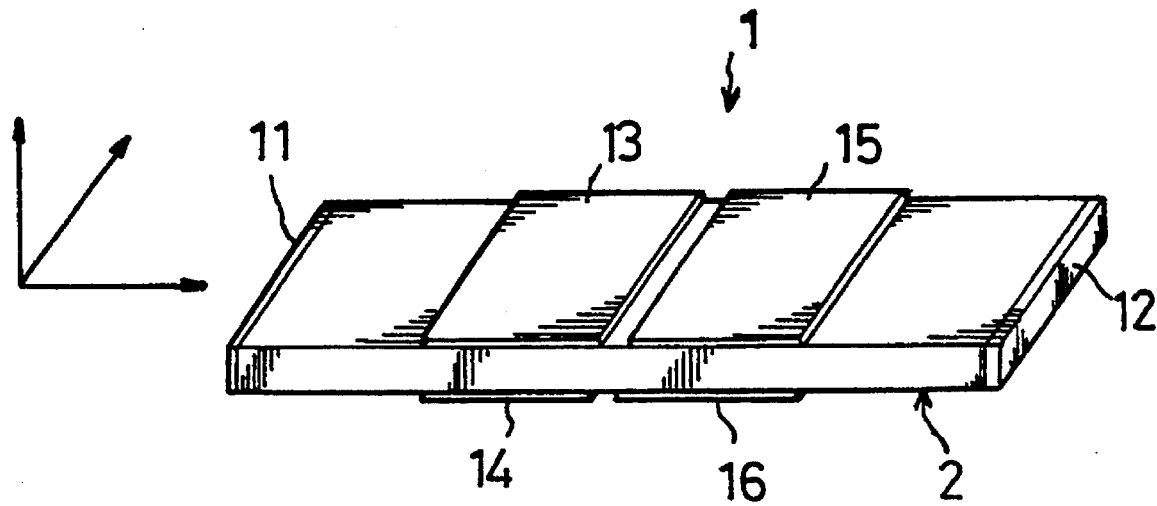
FIG. 1 is a perspective view of a piezoelectric ceramic transformer of a preferred embodiment in accordance with the present invention.
Figure 2:
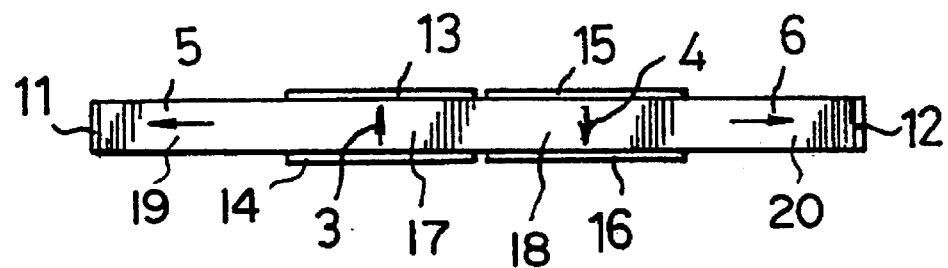
FIG. 2 is a schematic diagram showing the polarization directions and the positions of electrodes of the transformer in FIG. 1.

As shown in FIGS. 1 and 2, the piezoelectric ceramic transformer 1 in accordance with the present invention is in the form of a rectangular substrate 2. The substrate 2 has a first dimension (length), a second dimension (width) and a third dimension (thickness), wherein the first dimension is longest and the third dimension is shortest. The rectangular substrate 2 has a plurality of electrodes, such as those 11 and 12 on two terminals of the substrate 2, and two sets of symmetric electrodes 13, 14 and 15, 16 respectively on top and bottom of a central portion of the substrate 2 with those 13 and 15 on the top and 14 and 16 on the bottom thereof. The length of each of the electrodes 13, 14, 15 and 16 is about ¼ of that of substrate 2 and the distance between the electrodes 13 and 15 (and 14 and 16) is about ½ of the thickness of the substrate 2.

As shown in FIG. 2, the central portion of the substrate 2 is actually divided into two portions, one portion 17 coated by the set of electrodes 13, 14 and the other portion 18 coated by the set of electrodes 15, 16. Both of the portions 17 and 18 are polarized transversely to the plane of the substrate 2, but opposed in direction as indicated by arrows 3, 4, respectively. The remaining portions, i.e., the portion 19 on the left side of the central portion and the portion 20 on the right side of the central portion, are polarized longitudinally in directions generally indicated by arrows 5 and 6, respectively. The polarization directions of the portions 19 and 20 can be identical or opposite to one another, and the length of each of the portions 19 and 20 is about ¼ of that of the substrate 2.

Figure 3A:
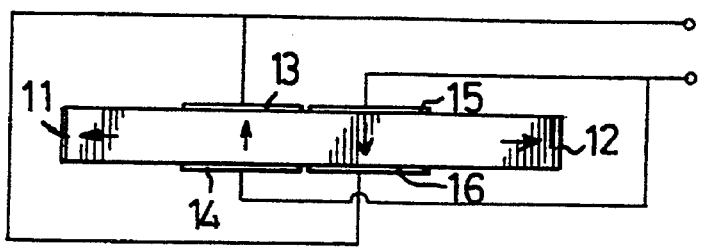
FIGS. 3(a) and 3(b) are an exemplary diagram and a frequency-impedance characteristic curve, respectively, showing the connection manner and the frequency-impedance characteristics of the transformer in FIG. 1 at a $\lambda/2$ operation mode.
Figure 3B:
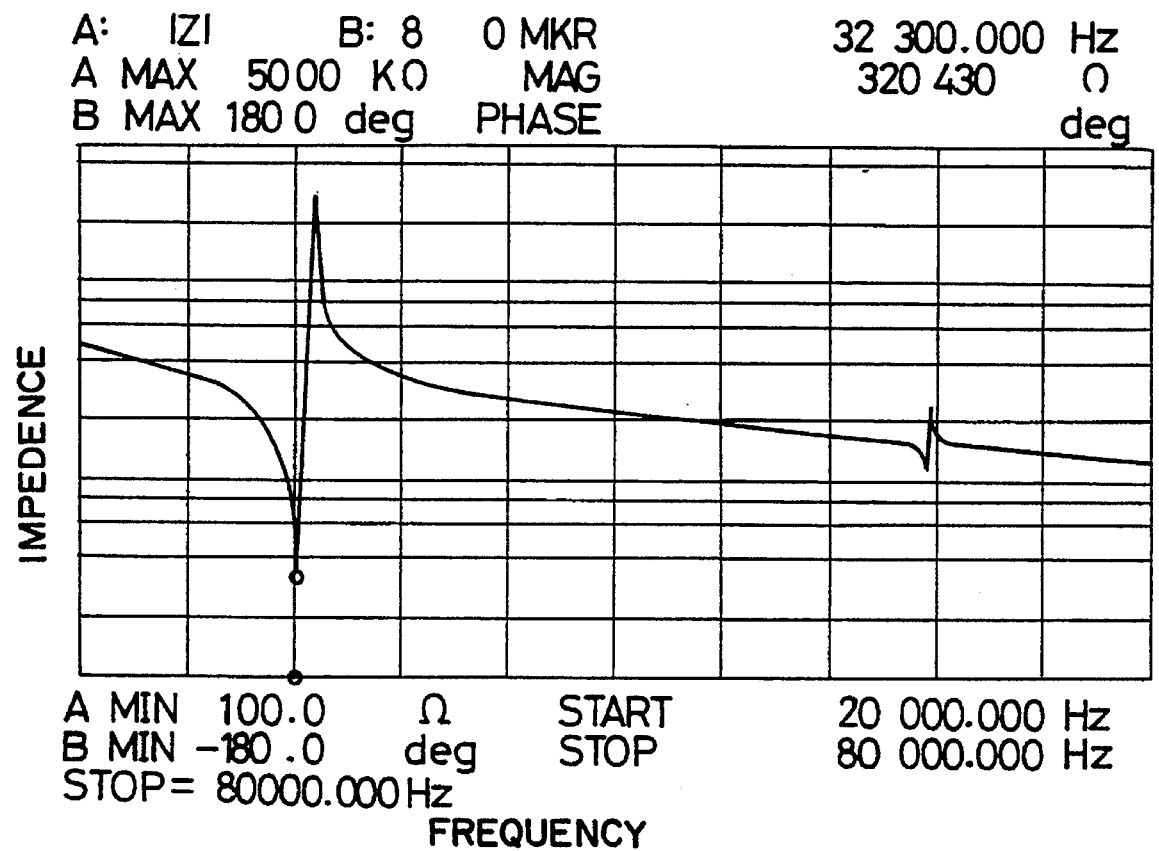

In accordance with the present invention, the transformer 1 can produce various voltages or currents by changing the connection manner of the electrodes. The transformed ratio of the voltage or current is also adjustable in the same way. The followings illustrate the characteristics and functions of the present invention:

(A) λ/2 mode connection and the frequency-impedance characteristics thereof:

To obtain a λ/2 operation mode, the substrate 2 of the transformer 1 is connected as shown in FIG. 3(a) by connecting the electrodes 13 and 16, 14 and 15 together respectively so that the λ operation mode is disabled. The frequency-impedance characteristic curve of such connection is illustrated in FIG. 3(b) in which only the λ/2 operation mode is enabled.

Figure 4A:
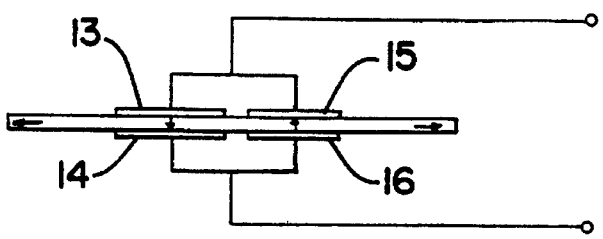
FIGS. 4(a) and 4(b) are an exemplary diagram and a frequency-impedance characteristic curve, respectively, showing the connection manner and the frequency-impedance characteristics of the transformer in FIG. 1 at a $\lambda$ operation mode; in such case, no gap is need between the adjustable electrodes 13 and 15 or 14 and 16.
Figure 4B:
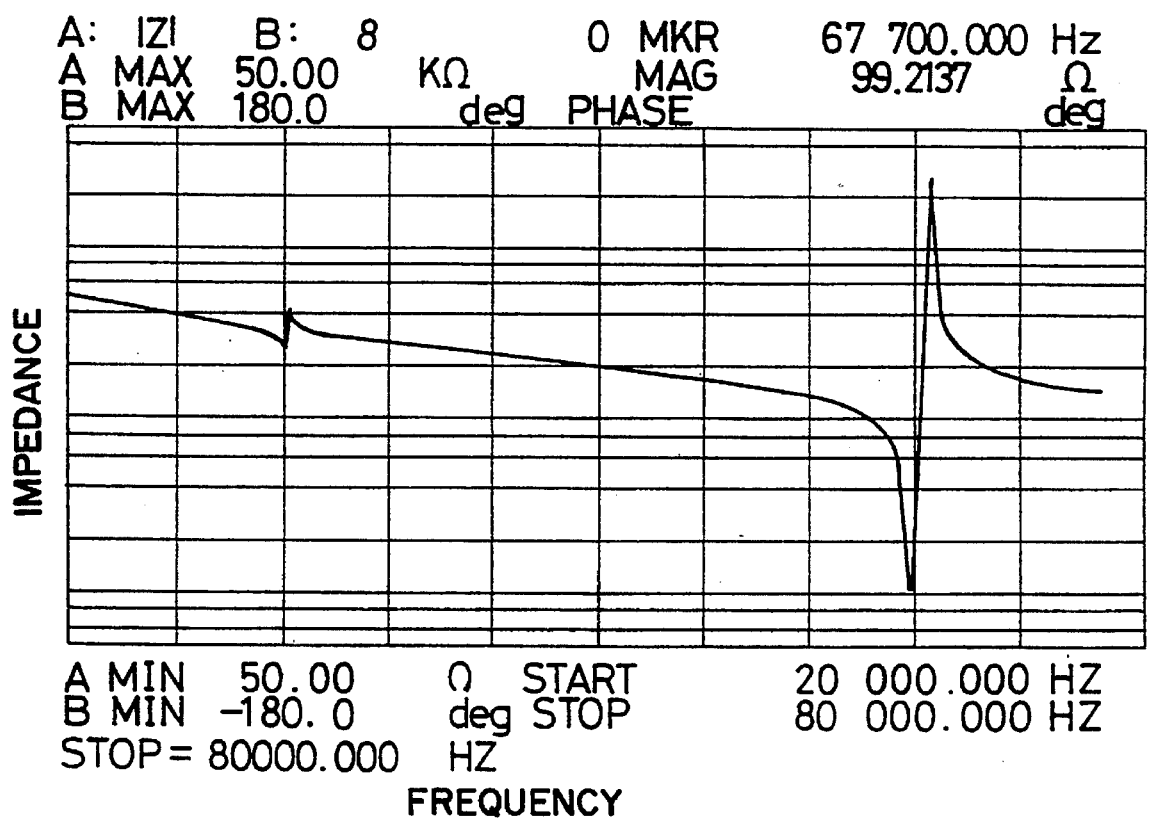

(B) λ mode connection and the frequency-impedance characteristics thereof:

To obtain a λ operation mode, the substrate 2 of the present invention is connected as shown in FIG. 4(a) by connecting the electrodes 13 and 15, 14 and 16 together respectively so that the λ/2 operation mode can be disabled. The frequency-impedance characteristic curve after such a connection is illustrated in FIG. 4(b) in which only the λ operation mode is enabled.

Figure 5A:
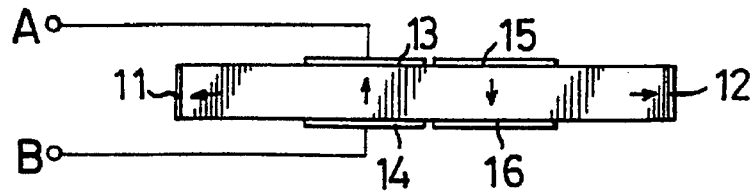
FIGS. 5(a) and 5(b) are an exemplary diagram and a frequency-impedance characteristic curve, respectively, showing the connection manner and the frequency-impedance characteristic of the transformer in FIG. 1 at both λ and λ/2 operation modes.
Figure 5B:
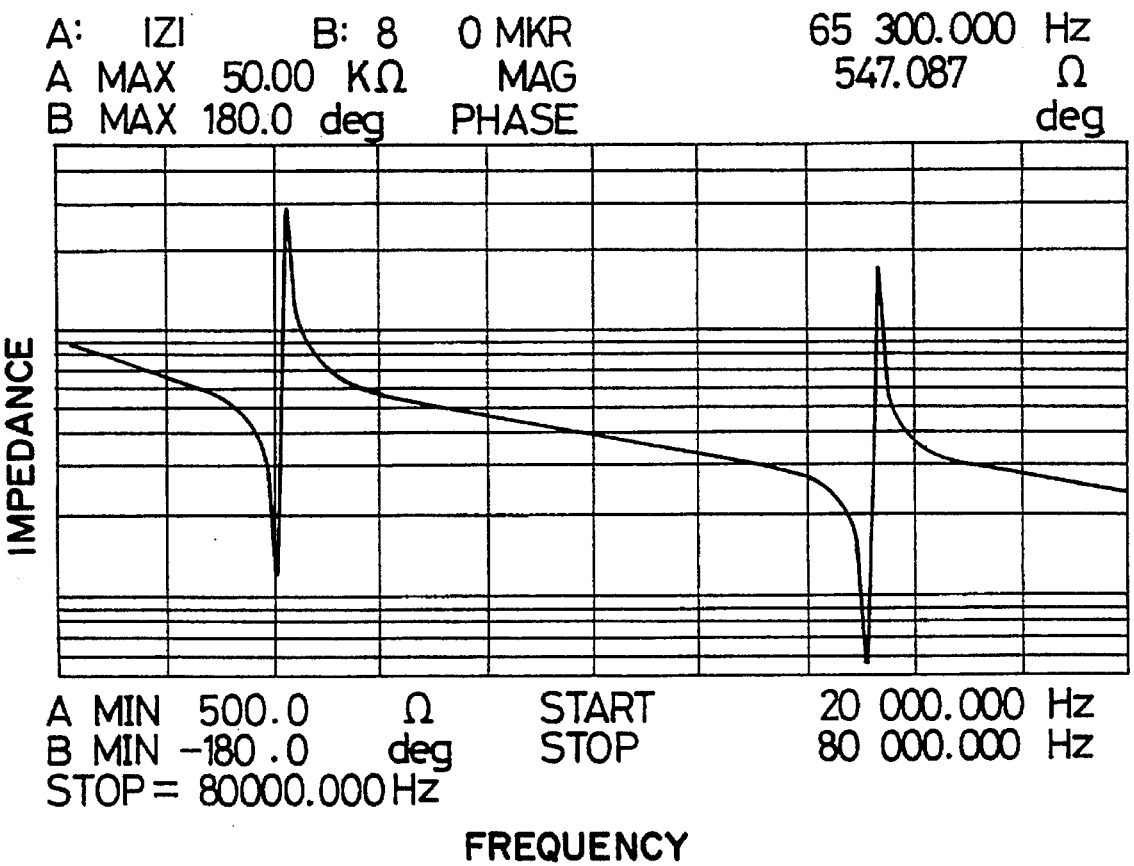

(C) λ/2 and λ operation modes and the frequency-impedance characteristic thereof:

By respectively connecting the electrodes 13 and 14 of the substrate 2 of the present invention to terminals A and B as shown in FIG. 5(a), the λ/2 and λ operation modes will exist simultaneously. The frequency-impedance characteristic curve after such a connection is illustrated in FIG. 5(b).

Figure 6A:
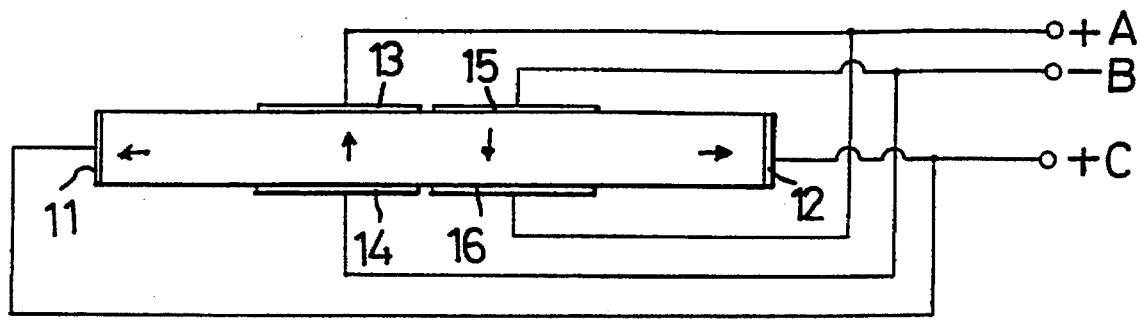
FIGS. 6(a) and 6(b) are an exemplary diagram and a transformed voltage-frequency characteristic curve, respectively, showing the connection manner and the transformed voltage-frequency characteristics of the transformer in FIG. 1 at the λ/2 operation mode.
Figure 6B:
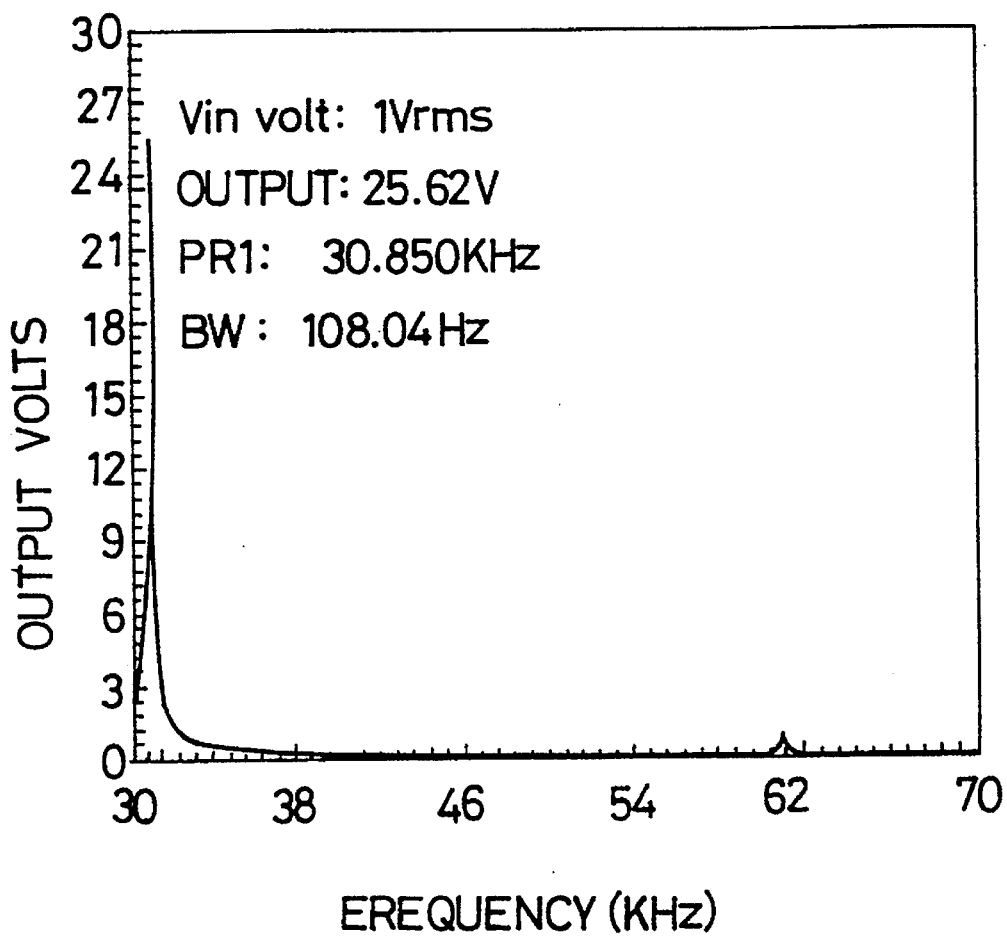

Accordingly, we can see that the piezoelectric substrate 2 of the present invention has a plurality of operation modes which are adjustable by changing the connection manner of the electrodes. The present invention can select freely the desired operation modes: λ/2 operation mode and/or the λ operation mode without the above-mentioned disadvantages found in the prior art. Therefore, the transformer of the present invention is suitably used in oscillator, filters and transforming means. The following will further describe the electronic output characteristics of the present invention for understanding:

(D) λ/2 operation mode and the transformed voltage-frequency characteristic thereof:

As shown in FIG. 6(a), the connection manner of the electrodes is to make electrodes 13 and 16 connected to a first terminal A, electrodes 14 and 15 to a second terminal B and electrodes 11 and 12 to a third terminal C and to make the terminals A and B be input ports and the terminals B and C be output ports. In such a manner, the λ operation mode of the transformer is disabled and the λ/2 operation mode is enabled. Therefore, the transformed voltage-frequency characteristic curve is as shown in FIG. 6(b).

Figure 7:
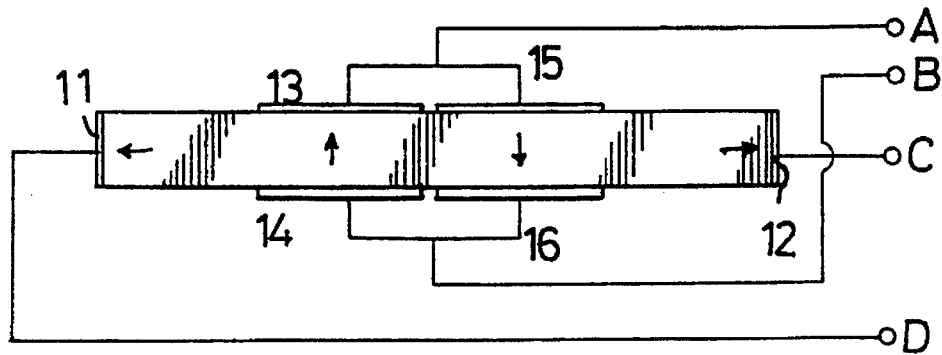
FIGS. 7(a) and 7(b) are an exemplary diagram and a transformed voltage-frequency characteristic curve, respectively, showing the connection manner and the transformed voltage-frequency characteristics of the transformer in FIG. 1 at the λ operation mode; in such case, no gap is needed between the adjustable electrodes 13 and 15 or 14 and 16.
Figure 7B:
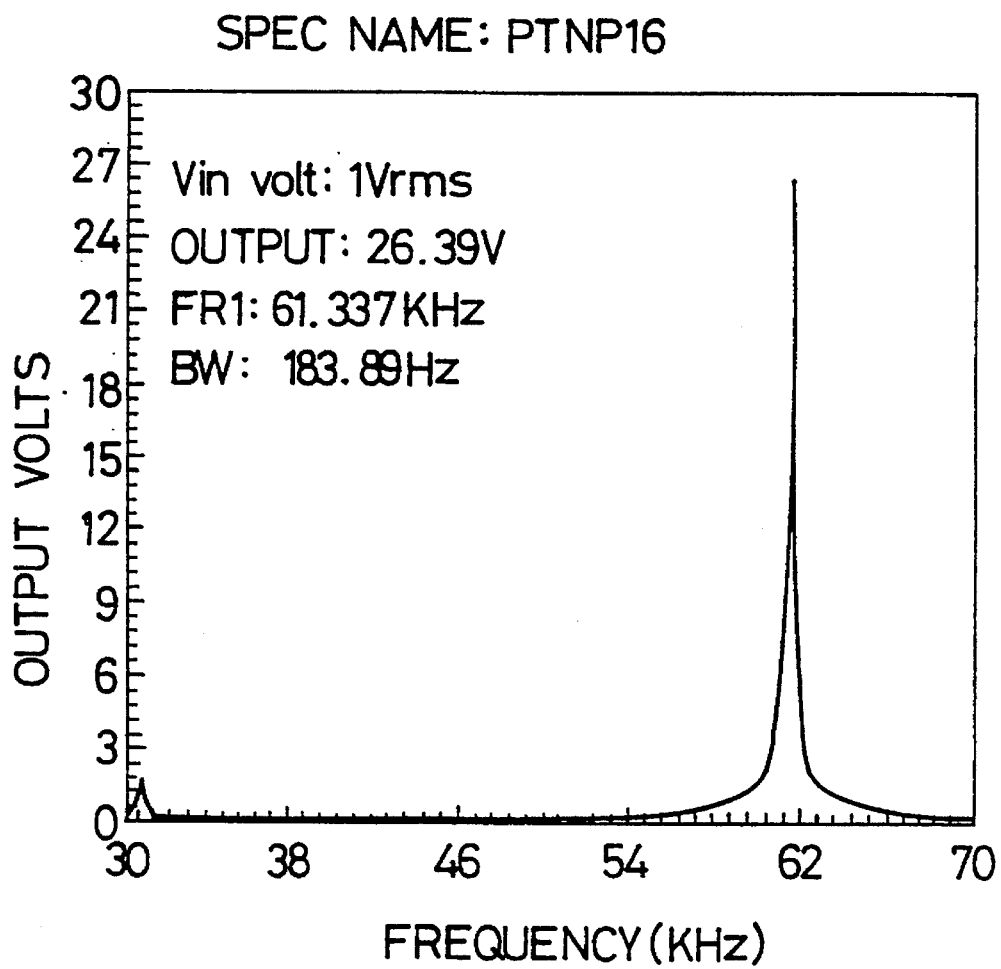

(E) λ operation mode and the transformed voltage-frequency characteristic thereof:

If connecting electrodes 13 and 15 to the terminal A, electrodes 14 and 16 to the terminal B, electrodes 12 to the terminal C and electrode 11 to a fourth terminal D and then making terminals A and B be input ports, terminals C and D be output ports, as shown in FIG. 7(a), the λ/2 operation mode will be disabled and λ operation mode be enabled. The transformed voltage-frequency characteristic curve resulting from the above connection will be as shown in FIG. 7(b).

Figure 8A:
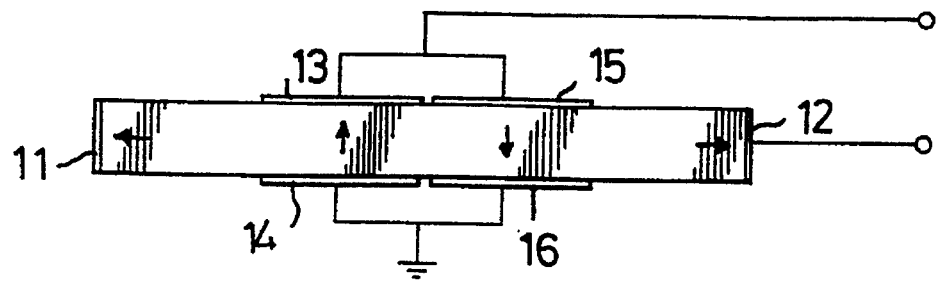
FIGS. 8(a) and 8(b) are exemplary diagram and a transformed voltage-frequency characteristic curve, respectively, showing the connection manner and transformed voltage-frequency characteristics of the transformer in FIG. 1 at both λ and λ/2 operation modes while the voltage amplitude at the λ operation mode has a larger value.
Figure 8B:
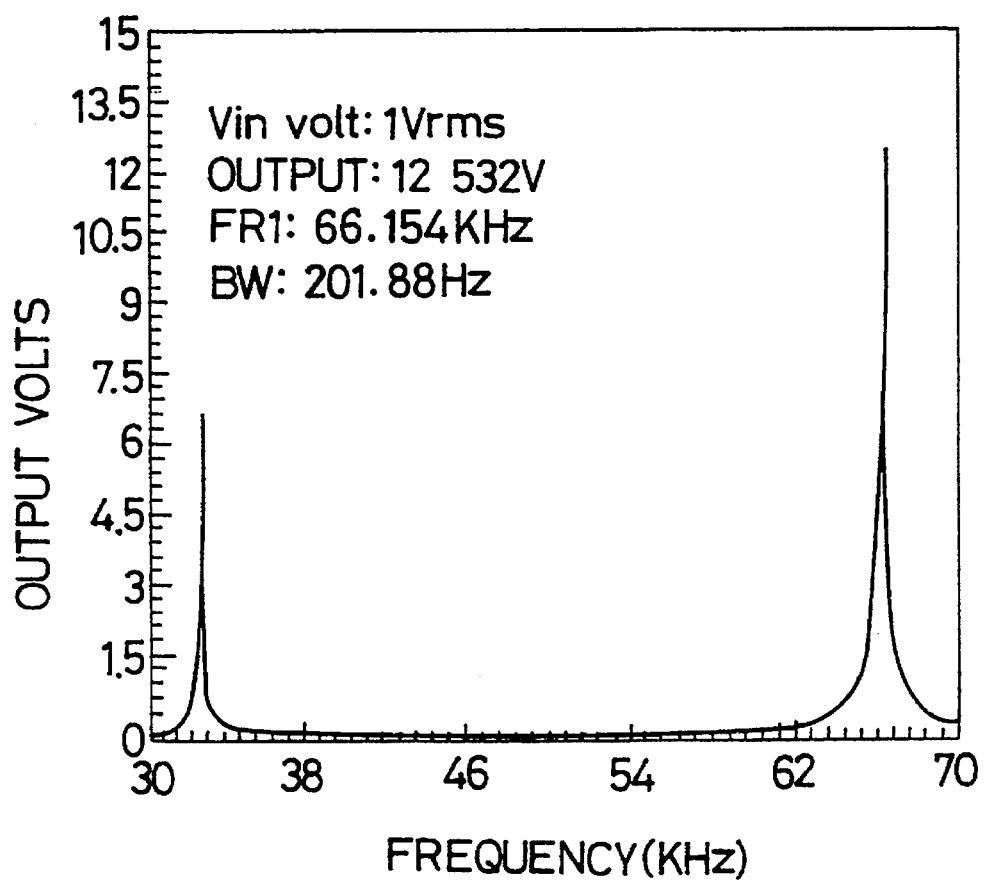

(F) λ and λ/2 operation modes and the transformed voltage-frequency characteristic thereof:

If connecting the electrodes 11–16 as shown in FIG. 8 and 9, the λ operation mode and the λ/2 operation mode will exist simultaneously in the operation of the transformer. In FIG. 8(a), the electrodes 13 and 15 are connected to the terminal A, electrodes 14 and 16 to ground and the electrode 12 to the terminal B and the terminals A and B are used as an input port and an output port, respectively. In this case, the λ mode and λ/2 operation modes exist simultaneously, while the voltage amplitude at the mode is more obvious than that at the λ/2 mode. The transformed voltage-frequency output characteristic curve is as shown in FIG. 8(b).

Figure 9A:
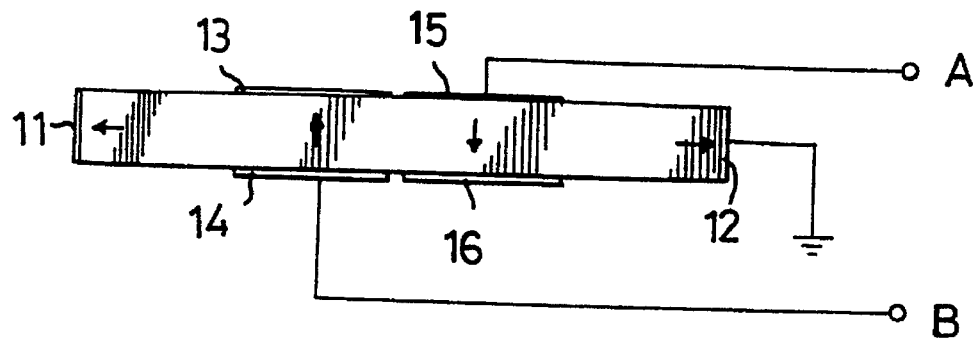
FIGS. 9(a) and 9(b) are an exemplary diagram and a transformed voltage-frequency characteristic curve, respectively, showing the connection manner and the transformed voltage-frequency characteristics of the transformer in FIG. 1 at both λ and λ/2 vibration modes while the voltage amplitude at the λ/2 vibration mode has a larger value.
Figure 9B:
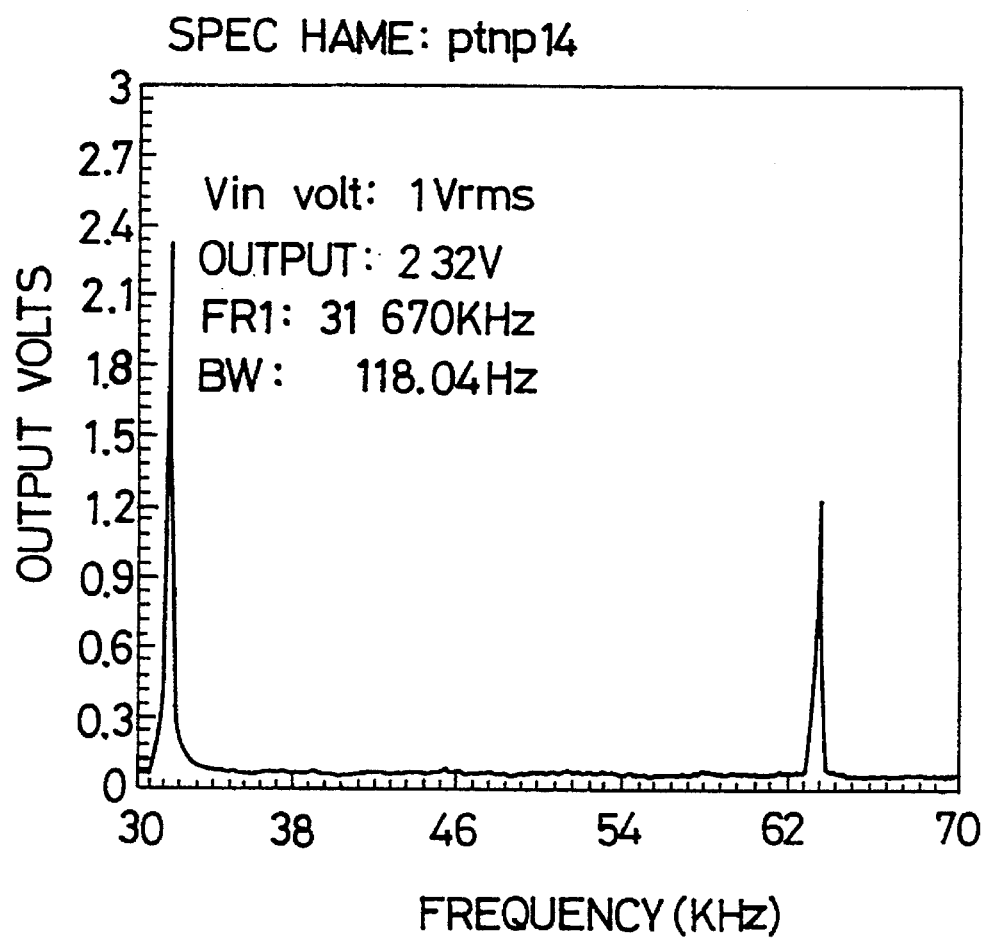

In FIG. 9(a), the electrodes 14 and 15 are connected respectively to the terminals B and A and the electrode 12 to the ground. Further, the terminals A and B are used as an input port and output port, respectively. In this manner, the λ mode and λ/2 operation modes will exist simultaneously in the operation of the transformer, while the voltage amplitude at the λ/2 operation mode is larger than that at the operation mode. The transformed voltage characteristic curve is as shown in FIG. 9(b).

There are still many connection manners in the present invention to make the λ and λ/2 operation modes exist simultaneously. Since the connection manners of the electrodes are not the main features of the present invention, there is no need to further describe them.

In view of the above, it is apparent that the piezoelectric transformer in accordance with the present invention is adjustable to have various transformed characteristics and operation modes. By changing the connection manners of the electrodes, the transformer of the present invention will have a plurality of input/output assemblies. Therefore, the present invention can be utilized in many applications.

According to the experimental results for the substrates with a same size, the voltage needed in polarization in the present invention is only half of that needed by the prior art, for example the transformer disclosed in U.S. Pat. Nos. 3,736,446 and 2,830,274. Further, the present invention has higher operational frequency whereby the noise generated in operation can be largely reduced. For example, if the substrates have a same size of 110 mm×25 mm×1.5 mm, the operational frequency of the transformer of U.S. Pat. No. 2,830,274 is 14.66 KHz which is detectable by the human ear, while in the present invention, the operational frequency is 29.07 KHz which is in the region of the ultra-sonic wave and can not be detected by the human ear. Accordingly, the disadvantages of a low operational frequency and a large amount of noise as that occurring in the prior art can be overcome by the present invention.

Figure 10:
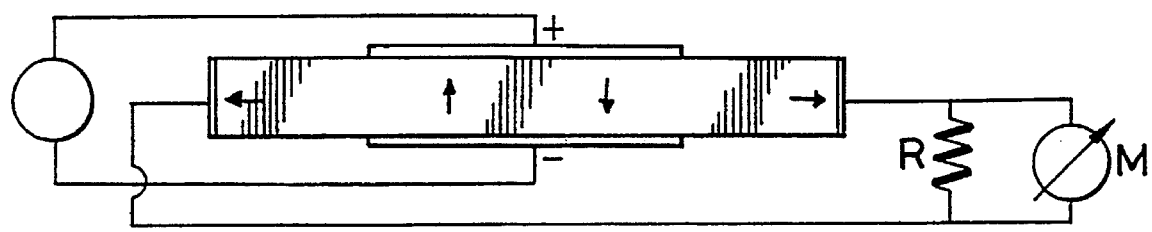
FIG. 10 shows a diagram of a piezoelectric transformer of another preferred embodiment in accordance with the present invention in which the transformer is connected parallel with a load.
Figure 11:
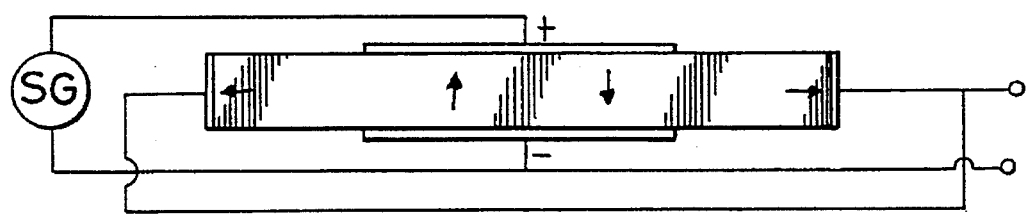
FIG. 11 shows a diagram of a piezoelectric transformer of a further preferred embodiment in accordance with the present invention in which the transformer is connected serially with a load.
Figure 12:
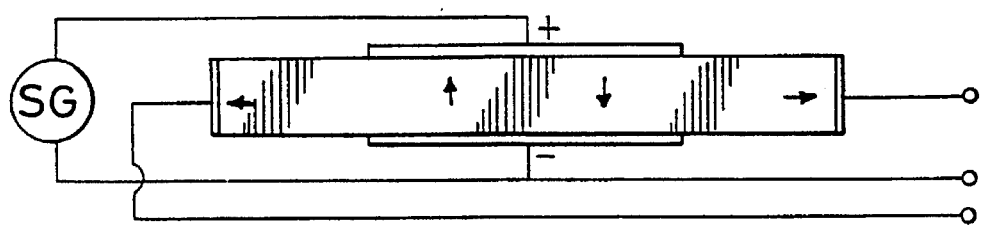
FIG. 12 shows a connection diagram of the transformer in FIG. 10 for a single-terminal output.
Figure 13:
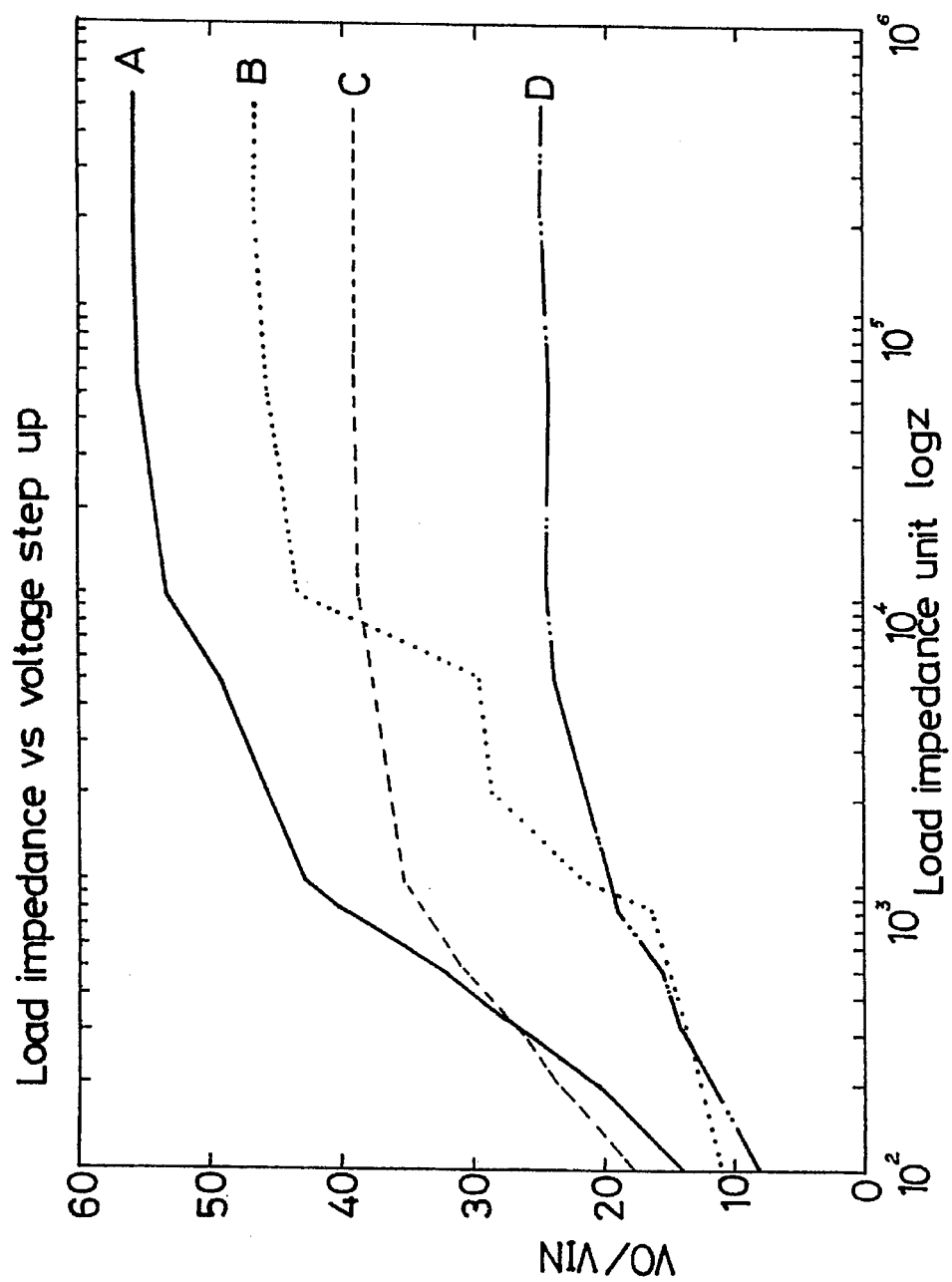
FIG. 13 shows relationship curves of the output transformed ratio and load impedance of various transformers in accordance with the embodiment shown in FIG. 10 of the present invention.
Figure 14:
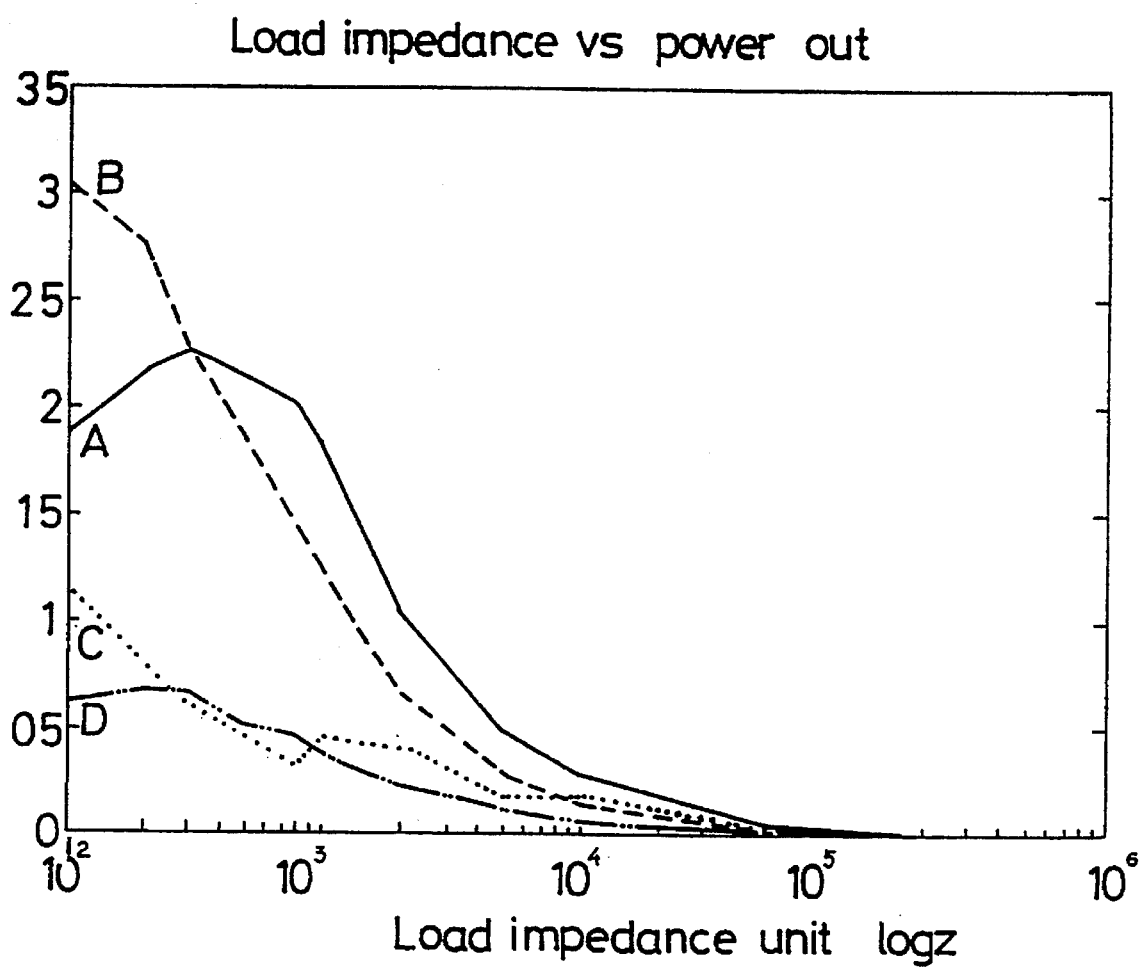
FIG. 14 shows relationship curves of the output power and load impedance of various transformers in accordance with the embodiment shown in FIG. 10 of the present invention.

The electrodes of the substrate 2 of the present invention can further be connected with a load in parallel (as shown in FIG. 10), serially (as shown in FIG. 11) or to have a single side output (as shown in FIG. 12). The comparison curves of the present invention with a conventional ROSEN-type piezoelectric transformers are as shown in FIGS. 13 and 14. FIG. 13 shows the relationship curves of the transformed voltage and the load impedance and FIG. 14 shows the relationship curves of the output power and the load impedance. In these drawings, Curve A represents a measurement when the transformer of the present invention is connected in serial (in FIG. 11), Curve B represents a measurement when the transformer of the present invention is connected in parallel (in FIG. 10), Curve C represents a measurement when the transformer is connected to have a single-side output (see FIG. 12) and Curve D represents a measurement of the conventional ROSEN-type transformer. It is obvious from the above that the present invention has better voltage gain and output power than the conventional transformer.

As various possible embodiments might be made of the above invention without departing from the scope of the invention, it should be understood that all matters herein described or shown in the accompanying drawings are to be interpreted as illustrative and not in a limiting sense. Thus, it will be appreciated that the scope of the invention is intended to be limited only by the scope of the appended claims.

We claim:

1. A multi-mode adjustable piezoelectric transformer, comprising a piezoelectric substrate having a first dimension, a second dimension and a third dimension, wherein said first dimension is longest and said third dimension is shortest; said substrate being polarized to have two polarization directions each near a respective end of said first dimension and parallel to said first dimension, and at least two opposite polarization directions on a central portion of said substrate which are parallel to said third dimension; said substrate comprising two terminals formed on said substrate at respective ends of said first dimension, and at least two electrodes formed on a portion of said substrate horizontal to said first dimension, wherein said electrodes are selectable to result in various operational frequencies and operation modes which comprise λ/2 and λ operation modes.

2. A multi-mode adjustable piezoelectric transformer as claimed in claim 1, wherein said first, second and third dimensions are the length, width and thickness of said substrate.

3. A multi-mode adjustable piezoelectric transformer as claimed in claim 1, comprising at least one electrode on either of said two terminals of said substrate.

4. A multi-mode adjustable piezoelectric transformer as claimed in claim 1, wherein said two opposite polarization directions are also normal, in the vertical direction, to said second dimension.

5. A multi-mode adjustable piezoelectric transformer as claimed in claim 1, wherein said substrate is rectangular.

6. A multi-mode adjustable piezoelectric transformer as claimed in claim 1, wherein said substrate further comprises two electrodes respectively set on said two terminals of said substrate.

7. A multi-mode adjustable piezoelectric transformer as claimed in claim 3, wherein said substrate comprises two sets of central electrodes set on top and bottom of said central portion of said substrate, respectively.

8. A multi-mode adjustable piezoelectric transformer as claimed in claim 7, wherein the length of the portion of the substrate not covered by electrodes is about half of the total length of said substrate.

9. A multi-mode adjustable piezoelectric transformer as claimed in claim 7, wherein said central electrodes on the top of said substrate are substantially the same in area.

10. A multi-mode adjustable piezoelectric transformer as claimed in claim 7, wherein said central electrodes on the bottom of said substrate are substantially the same in area.

11. A multi-mode adjustable piezoelectric transformer as claimed in claim 7, wherein said substrate comprises at least six electrodes.

12. A multi-mode adjustable piezoelectric transformer as claimed in claim 1, wherein the polarization directions on said two terminals of said substrate are identical.

13. A multi-mode adjustable piezoelectric transformer as claimed in claim 1, wherein the polarization directions on the two terminals of said substrate are opposite to one another.

14. A multi-mode adjustable piezoelectric transformer as claimed in claim 7, wherein the length of each of said electrodes of the central portion is ¼ of that of said substrate.

15. A multi-mode adjustable piezoelectric transformer as claimed in claim 6, wherein each length of portions of said substrate between said central portion and each respective end of said substrate is respectively ¼ of a total length of the substrate of the substrate.

16. A multi-mode adjustable piezoelectric transformer as claimed in claim 6, wherein said substrate comprises two central electrodes on the top and the bottom of said central portion of said substrate, respectively.

17. A multi-mode adjustable piezoelectric transformer as claimed in claim 16, wherein the length of the portion of said substrate not covered by electrodes is about half of that of said substrate.

18. A multi-mode adjustable piezoelectric transformer as claimed in claim 16, wherein said two electrodes on the top and bottom of said substrate are substantially the same in area.

19. A multi-mode adjustable piezoelectric transformer as claimed in claim 16, wherein said substrate comprises six electrodes at least.

20. A multi-mode adjustable piezoelectric transformer as claimed in claim 16, wherein the length of each of said central electrodes is ¼ of the length of said substrate.

* * * * *